(12) United States Patent
Muralimanohar et al.

(10) Patent No.: US 10,754,582 B2
(45) Date of Patent: Aug. 25, 2020

(54) ASSIGNING DATA TO A RESISTIVE MEMORY ARRAY BASED ON A SIGNIFICANCE LEVEL

(71) Applicant: Hewlett Packard Enterprise Development LP, Houston, TX (US)

(72) Inventors: Naveen Muralimanohar, Palo Alto, CA (US); Ali Shafiee Ardestani, Palo Alto, CA (US); Ben Feinberg, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 52 days.

(21) Appl. No.: 16/073,534

(22) PCT Filed: Mar. 31, 2016

(86) PCT No.: PCT/US2016/025155
§ 371 (c)(1),
(2) Date: Jul. 27, 2018

(87) PCT Pub. No.: WO2017/171773
PCT Pub. Date: Oct. 5, 2017

(65) Prior Publication Data
US 2019/0065118 A1  Feb. 28, 2019

(51) Int. Cl.
*G06F 13/00* (2006.01)
*G06F 3/06* (2006.01)
(Continued)

(52) U.S. Cl.
CPC .......... *G06F 3/0659* (2013.01); *G06F 3/0604* (2013.01); *G06F 3/0679* (2013.01);
(Continued)

(58) Field of Classification Search
CPC .................................................. G11C 11/56
(Continued)

(56) References Cited

U.S. PATENT DOCUMENTS 7,246,198 B2 * 7/2007 Nataraj ............... G11C 8/04
711/108
7,382,637 B1 * 6/2008 Rathnavelu ........ G11C 15/00
365/189.05
(Continued)

FOREIGN PATENT DOCUMENTS

CN  1522045 A  8/2004
CN  1950802 A  4/2007

OTHER PUBLICATIONS

Crivelli, D.E. et al., "Architecture of a Single-Chip 50 Gb/s DP-QPSK/BPSK Transceiver With Electronic Dispersion Compensation for Coherent Optical Channels". <http://ieeexplore.ieee.org/xpls/abs_all.jsp?arnumber=6632985&tag=1 > (Research Paper). IEEE Transactions on Circuits and Systems I: Regular Papers, vol. 61, No. 4, Oct. 17, 2013, pp. 1012-1025.

(Continued)

*Primary Examiner* — Min Huang (57) ABSTRACT

In an example, a method includes receiving input data and dividing the input data into a plurality of data portions, wherein the size of each data portion is based on a significance level. The input data may be assigned to at least one resistive memory array. Assigning the input data to at least one resistive memory array may comprises at least one of (i) assigning at least one data portion of the input data to be represented by a resistive memory array representing a number of bits, wherein the number of bits represented within the resistive memory array is based on the size of the at least one data portion; and (ii) processing each data portion of the input data with at least one resistive memory array.

15 Claims, 4 Drawing Sheets

(51) Int. Cl.
*G06F 12/02* (2006.01)
*G11C 13/00* (2006.01)

(52) U.S. Cl.
CPC ...... *G06F 12/0246* (2013.01); *G11C 13/0002* (2013.01); *G06F 2212/1032* (2013.01); *G06F 2212/7202* (2013.01); *G11C 13/0007* (2013.01); *G11C 2213/77* (2013.01); *Y02D 10/13* (2018.01)

(58) Field of Classification Search
USPC ........................................................ 711/154
See application file for complete search history.

(56) References Cited

U.S. PATENT DOCUMENTS

| | | | |
|---|---|---|---|
| 8,577,948 B2 | 11/2013 | Srinivasan et al. | |
| 8,626,813 B1 | 1/2014 | Swartzlander et al. | |
| 2006/0106910 A1 | 5/2006 | An | |
| 2008/0046856 A1* | 2/2008 | Gajjewar | G06F 17/5045 |
| | | | 716/102 |
| 2012/0198135 A1 | 8/2012 | Chilappagari | |
| 2014/0149639 A1* | 5/2014 | Sunkavalli | G06F 12/0238 |
| | | | 711/103 |
| 2014/0344194 A1 | 11/2014 | Lee et al. | |
| 2015/0310311 A1 | 10/2015 | Shi et al. | |
| 2015/0347896 A1 | 12/2015 | Roy et al. | |
| 2016/0211035 A1* | 7/2016 | Shapira | G11C 16/3459 |

OTHER PUBLICATIONS

Demme, J. et al., "Increasing Reconfigurability with Memristive Interconnects," Oct. 18-21, pp. 351-358, http://www.cs.columbia.edu/~jdd/papers/iccd15.pdf.

Hu, M. et al., "Dot-Product Engine for Neuromorphic Computing: Programming 1T1M Crossbar to Accelerate Matrix-Vector Multiplication," Mar. 3, 2016, pp. 1-6, https://www.labs.hpe.com/publications/HPE-2016-23.pdf.

International Search Report & Written Opinion received in PCT Application No. PCT/US2016/025155, dated Dec. 15, 2016, 14 pages.

Miao Hu et al. "Dot-Product Engine for Neuromorphic Computing: Programming 1T1M Crossbar to Accelerate Matrix-Vector Multiplication". Proceedings of the 53rd Annual Design Automation Conference On. DAC '18, ACM Press, New York, New York. USA. Jun. 5, 2016. pp. 1-6. XP058258018. DOI: 10.1145/2697837.2886010 ISBN: 978-1-4503-4236-0 Retrieved from the Internet: URL:http://ieeexplore.ieee.org/document/75_44263/ [retrieved on Jun. 5, 2016].

Morad, A. et al., "Efficient Dense and Sparse Matrix Multiplication on GP-SIMD," Oct. 1, 2014, pp. 1-8, http://webee.technion.ac.il/people/ran/papers/SparseMMonGP-SIMD-2014.pdf.

* cited by examiner

Fig. 7

ASSIGNING DATA TO A RESISTIVE MEMORY ARRAY BASED ON A SIGNIFICANCE LEVEL

BACKGROUND

Resistive memory devices such as "memristors" have been described in which an electrical component is capable of being written with a resistance in a non-volatile manner. Use of arrays of such devices has been proposed for carrying out logical operations.

BRIEF DESCRIPTION OF DRAWINGS

Non-limiting examples will now be described with reference to the accompanying drawings, in which.

DETAILED DESCRIPTION

Figure 1:
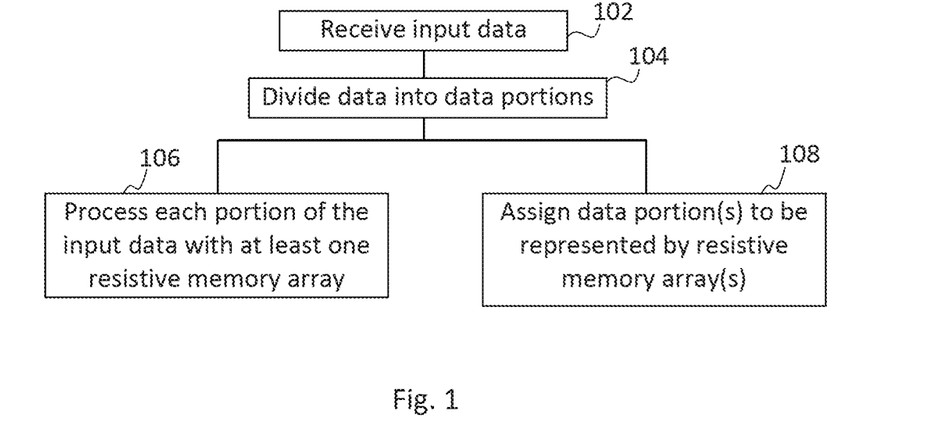
FIG. 1 is a flowchart of an example of a method for assigning data to a resistive memory array based on a significance level.

FIG. 1 shows an example of a method, which may for example be implemented by at least one processor. In block 102, input data is received. The data may be input data which is intended to undergo logical processing. For example, the data may be representative of at least a portion of an image on which object or text recognition is to be performed, or audio data on which speech recognition is to be performed, or may be the results of scientific experiment from which conclusions or other information is to be extracted, or any other form of data for any form of processing. In some examples, the input data is representative of at least part of an operand or operating kernel to be written to a resistive memory array. For example, the input data may be, or may be derived from, a matrix which is to be represented by an array of resistive memory devices, and which is to be used to process other data which is intended to undergo logical processing.

In block 104, the input data is divided into a plurality of data portions, wherein the size of each data portion is based on a significance level, which may be a significance level associated with that data portion. As the term is used herein, the significance level may be associated with an intended processing accuracy level. As will be set out in greater detail below, in some examples, it may be that there is a trade-off between computational resources used and computational accuracy. A high significance level may be associated with an intention to process the data with a high level of computational accuracy (or, in some examples, a low bit error rate), even if this results in an increase in the processing resources (for example, an increase in at least one of the time, energy or hardware used to carry out the processing operation). In other examples, a higher significance level may be associated with data having a greater impact on an output than data associated with a lower significance level. In some examples, the data portion may comprise a 'bit slice'. A bit slice may be associated with the position of the bits within value(s) in the data input. For example, a bit slice may comprise the first n bits of value(s) of input data, and another bit slice may comprise the next m bits of each value, and so on (where n and m are any integer greater than or equal to one).

The significance level may be already associated with the input data, for example, the data may be tagged as comprising data portions having a 'high', low' or 'medium' significance, or may be tagged with an indication that it is to be divided into portions of a predetermined size. In other examples, operations may be carried out on the data to determine significance levels and/or data portions. For example, the significance level/portion size may be determined based on the type of data received, the processing to be performed on or using the data, and/or according to user preference. For example image recognition may, in some applications (which may be user defined) be carried out with a higher tolerance for computational errors (and thus a lower level of computational accuracy) than the results of a particular scientific experiment. In some examples, a user may opt for lower processing overhead (use of a smaller number of arrays and/or a faster processing time) over accuracy for at least some data portions, while in others a higher level of accuracy may be adopted over a speedy result.

In some examples, the data itself may be analysed to determine if that particular data input portion is to be processed with a high level of accuracy or if a lower level of accuracy is acceptable, i.e. the determination is based on the content of the data. For example, when performing a multiplication of two 64 bit values, or on 512 bit values (for example a fixed point 512 bit number derived from a double or float), the most significant bits are less tolerant to faults than least significant bits. To consider an example in base 10, if some number is to represented, for example, 138, an error associated with the last digit has a smaller impact than an error in the first digit. A similar principle may be applied to base 2 numbers. In an example, the input data may be representative of a processing kernel to be represented by an array of resistive memory elements. Such a processing kernel may comprise an array of values, each value comprising, for the sake of this example, six data bits. The leading data bits of each value may be assigned a higher significance value than the middle or trailing bits of the data. Therefore, a first data portion may be a bit slice having a size of one bit per value and may represent the first bit of the or each value, and a second data portion may be a bit slice having a size of two bits per value, representing the second and third bit of the or each value, and a third data portion may be a bit slice having a size of three bits per value, representing the trailing three bits of the or each value.

To consider another example from the field of image processing, it may be acceptable to process a collection of pixels having little or no variation in color with a lower level of accuracy that a collection of pixels having a more dynamic range of variation. In the field of speech recognition, sounds which are outside a range of frequencies associated with human speech may be processed with a lower accuracy than those within the range. The identification of a significance level of the data may vary between application types—for example whether the output may have a high importance (for example, a significant financial or other impact), or whether the output is more for information or entertainment. Thus, the application of the output, i.e. the context within which the data is being processed, may be considered to determine a significance level.

The significance level may be both data and context dependent. For instance, in scientific computing the computation accuracy may be determined to match the level of precision of a measurement instruments used. However bits falling below the precision of that instrument could be handled with lower precision without an impact on overall system precision.

The method of FIG. 1 further comprises assigning the input data for processing with at least one resistive memory array. This may comprise assigning a number of bits to be processed in a logical operation by one, or by each of a plurality of resistive memory arrays. This may for example comprise determining at least one of the number of bits represented by the array and/or a number of bits represented by the input to an array. In this example, this is achieved by carrying out one or both of blocks 106 and 108.

In block 106, each data portion is assigned for processing with a resistive memory array, for example, separately from the other(s) of the data portions. Thus, in some examples, a logical operation is carried out for each of a plurality of data portions (for example comprising bit slices) separately. In some examples data portions such as bit slices may be processed in turn with the same array. In some examples, the data portions may be processed with a plurality of different arrays, which may be in some cases be similarly specified arrays. In some examples, the input data may be divided into bit slices having fewer bits for data associated with a high significance than for data associated with a lower significance level. Each value within each bit slice may be input to a row of an array. For example, this may comprise assigning the most significant bits of the values of an input vector to applied to a resistive memory array with one bit of each value of the input vector being applied to each input row of an array, and less significant bits of each value of the input vector being applied such that two (or more) bits are represented in an input to each row.

In block 108, at least one data portion of the input data is assigned to be represented by a resistive memory array representing a number of bits, wherein the number of bits represented within the resistive memory array is based on the significance level of that data portion. In some examples, the number of bits represented by an array assigned to process an input data portion associated with a higher significance level is smaller than the number of bits represented by an array assigned to process an input data portion associated with a lower significance level. In some examples, the portions of the input data may have the same size, the size for example being determined according to the significance level of the input data, application type, or the like. In some examples, an array representing a number of bits may be selected for use based on the significance level. In some examples, an array may be controlled to represent a number of bits determined based on the significance level. For example, the most significant bits of the values of a matrix representing an operand may be represented by an array of resistive elements having a first number of bits, and the least significant bits may be associated with an array having a second (larger) number of bits. In order to complete a logical operation between an input vector and the original matrix, the vector may be applied to both the arrays and the outputs combined, as further set out below. In another example, the input data representing the matrix may be divided into portions such that a first subset of lines is represented by a first array and a second subset of lines is represented by a different array (or each subset may be mapped by the same array in which the subsets of line are activated alternately).

In some examples, blocks 106 and 108 may be carried out together. In such an example, input data representing at least part of an operand or processing kernel may be associated at least one significance level, and an array of resistive memory elements selected or controlled to represent a number of bits according to the significance level. Input data to be processed by such a kernel, for example, values within an input vector, may also be associated with at least one significance level and the number of bits of each value to be processed by each row of a resistive memory array may be determined according to the significance level.

Figure 2:
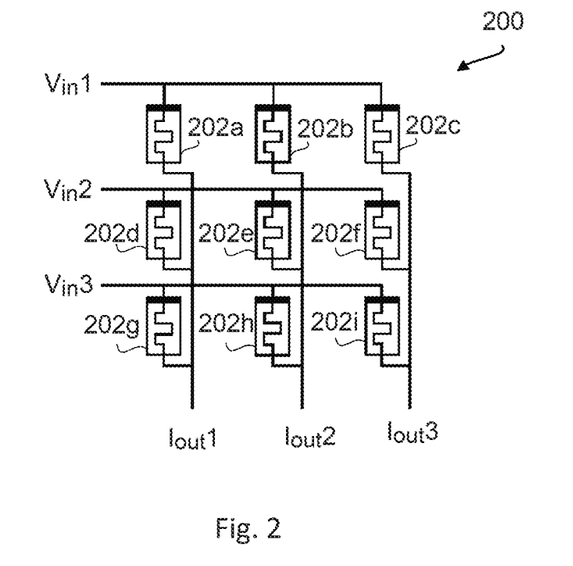
FIG. 2 is a simplified schematic of an example resistive memory array apparatus.

In an example, a resistive memory array comprises a two-dimensional grid of resistive memory elements, which may be a crossbar array. An example of a crossbar array 200 of resistive memory elements 202 (for example, memristors or other resistive memory elements) is shown in FIG. 2. This resistive memory array 200 comprises at least one input row to receive input data and each resistive memory element 202 has a (common) bit depth. While it may be the case that the bit depth of the resistive memory elements 202 could differ, this would present a relatively complex example. In this example, the term 'bit depth' is the number of bits that can be represented by a single resistive memory element 202 (an alternative description may be 'bit width'). In some examples, the elements 202 may represent a binary bit having one of two values for example, representing 0 or 1 (a bit depth of one bit), however resistive memory elements which can take a plurality of values, for example 32 distinct levels (a bit depth of five bits) have been demonstrated. Each element 202 lies in a wordline (i.e. input rows) and a bitline (or column). The array 200 can be 'programmed' by submitting the elements to voltage pulses, each voltage pulse incrementally changing the resistance of that element 202, and the resistance level is then 'remembered' by the elements 202 as a resistance level, even after a power supply is removed.

In some examples, such an array 200 can process an input voltage vector to provide an output vector in which the input values are weighted by the conductance at each element 202 of the array 200. This effectively means that the array 200 performs a dot product matrix operation on the input to produce an output. The weights of the elements 202 can be individually 'programmed' by subjecting the elements 202 to voltage pulses as outlined above. Such arrays 200 may be associated with high density, low power consumption, long cycling endurance and fast switching speeds. Such an array may therefore carry out matrix combination operations. In some examples, the array 200 may comprise part of a dot product engine for use in multiplying matrices together. Such dot product engines have been proposed for use in deep learning apparatus and to perform complex computational operations.

In an example, analogue data may be supplied for processing using a resistive memory array 200. The data may for example represent at least one pixel of an image, or a word (or sub-word or phrase) of speech, or results of a scientific experiment, or any other data. The input data may be provided as a vector, i.e. a one dimensional data string, and applied to the array as a voltage value (generally a voltage lower than that used to set the resistance of an array element 202, such that the resistance of the element 202 is not changed in this operation).

Unlike some memory arrays such as DRAM, where individual wordlines and at least one bitline are activated for a read or write activity, in a resistive memory array, a significant portion of an array 200 (sometimes the entire array 200) may be accessed to carry out a computation in a small (sometimes a minimum) number of cycles. A resistive memory crossbar array 200 used in such a manner can suffer from sneak and other error currents. Sneak currents may for example be seen when current passes through resistive memory elements which are intended to be in an 'off' or nonconductive state. Sneak currents can negatively impact both accuracy and energy consumption of an array. Every bit of the array may effectively add an error current to the output.

Error current may be associated with an error in the resistance level of an element 202. This error may be a function of memristor material and write speed, and it may not be practical to significantly reduce such errors. Another source of error is associated with the "IR drop" along the wordline and bitline. The voltage on a line degrades as it reaches elements at the distal ends of the lines. This error can be controlled to a certain extent by appropriate mapping techniques which account for this drop, for example by providing higher voltage or changing the resistance of elements that are more distant. However, error currents may still affect the accuracy of output of an array.

Each time the bit depth of an example array is increased (i.e. the more resistance levels which are to be represent the elements 202 of the array), the tolerance for such errors decreases as the distinction between the levels becomes smaller (i.e. in a 5 bit array, there are 32 levels, which may have the same or similar resistance range to a 1 bit array, in which there are two resistance levels).

In FIG. 2, the input voltages are shown as $V_{in}1$, $V_{in}2$ and $V_{in}3$ and output currents are shown as $I_{out}1$, $I_{out}2$ and $I_{out}3$. Every bit represented by the array will contribute $I\pm\Delta I$ current, where $\Delta I$ is a (usually relatively small) error current.

As the number of bits contributing to the total bitline current increases (for example by increasing the rows, by increasing the bit depth of the elements or the number of bits represented in the input value), these errors add up, in some examples leading to a significant contribution of the error current to the output current. This effect increases along the wordline, such that for bitlines which are distal to the inputs (to the right in FIG. 2), errors may generally be larger than for bitlines which are closer to the input.

When the output is converted to a digital output (for example by an analogue to digital converter), this can lead to bit errors. Bit errors may be made less frequent if the number of wordlines (rows) is smaller and/or by reducing the number of bits (the bit depth) per element 202. However, it may be noted reducing the number of bits represented by an array may increase the number of operations and/or arrays to process the input (as fewer input bits may be processed at once, and/or the range of values which can be represented by the arrays is reduced, and therefore the complexity of the logically operating which can be performed by a single array is reduced). This may also result in an increase of the energy consumed.

The number of bits represented by an array may depend on the number of input rows (or the number of activated input rows) and/or on a bit depth. Therefore, in some examples of the method of block 108 of FIG. 1, a resistive memory array assigned to input data portions associated with a higher significance level may have, or may be configured to have, at least one of (i) fewer input rows (or fewer activated input rows) and (ii) resistive memory elements with a smaller bit depth than a resistive memory array assigned to input data portions associated with a lower significance level. Resistive memory arrays assigned to input data or portions thereof may therefore have at least one of a differing number of rows (or differing number of activated rows) and a different bit depth based on the significance level of the data to be processed thereby.

There are other factors that impact the computational accuracy of such an array 200, for example the specification of related components such as Analogue to Digital and Digital to Analogue Converters (ADCs and DACs). In particular, it may be the case that a digital input in bits is converted to an analogue voltage level, and the output of the array is subject to analogue to digital conversion. In general, the number of output bits may be related to the number of input bits according to the following relationship (where $N_R$ is the number of rows, $M_b$ is the bit depth) and $DAC_b$ is the number of DAC bits input to each row):

$$ADCbits = \begin{cases} \log 2(N_R) + DAC_b + M_b & \text{if } DAC_b > 1 \\ \log 2(N_R) + M_b & \text{if } DAC_b = 1 \\ \log 2(N_R) + DAC_b & \text{if } M_b = 1 \end{cases}$$

However, as the bit depth of the resistive memory elements increases, it becomes more likely that the last few bits of ADC output may be corrupted. This is also true as the number of rows in an array increases.

A similar reasoning applies in relation to the number of bits represented by the elements of a voltage vector to be processed with a resistive memory array. As noted above, when applying voltage(s) representing data, the voltage level may be controlled so as to be below the level which may 'reprogram' the resistive memory elements 202. This may set a range for the applied voltage. Thus, as the number of bits which are to be represented as the input to a line of particular resistive memory array 200 increases, the analogue voltage representation of the input will tend to become more error prone as the distinction between voltage levels representing the values decreases. The outputs for different voltages (which may now tend to be closer to one another) may also be more similar, and thus more prone to error at the point of conversion to a digital value. Thus, by controlling the size of a bit slice to be processed by a given array 200, a likelihood of output errors may also be controlled. More significant data inputs could therefore be divided into data slices having fewer bits than data slices for less significant data inputs. In some examples, the data input may be divided into a number of bit slices which are processed by similarly specified resistive memory arrays, or in turn by the same resistive memory array. For example, "more significant" data portions could be applied to an array with one bit to each row, whereas "less significant" data portions could be applied to an array with two or three bits to each row. These numbers are given purely by way of example, and in other examples, the number of bits per row could be different.

Control of either the size of the input data slice (i.e. the number of bits of a value of input vector which are represented as a voltage input to a line of the resistive memory array) and of the bit depth of an array may therefore each independently effect the accuracy of the output, and these techniques may also be combined.

Figure 3:
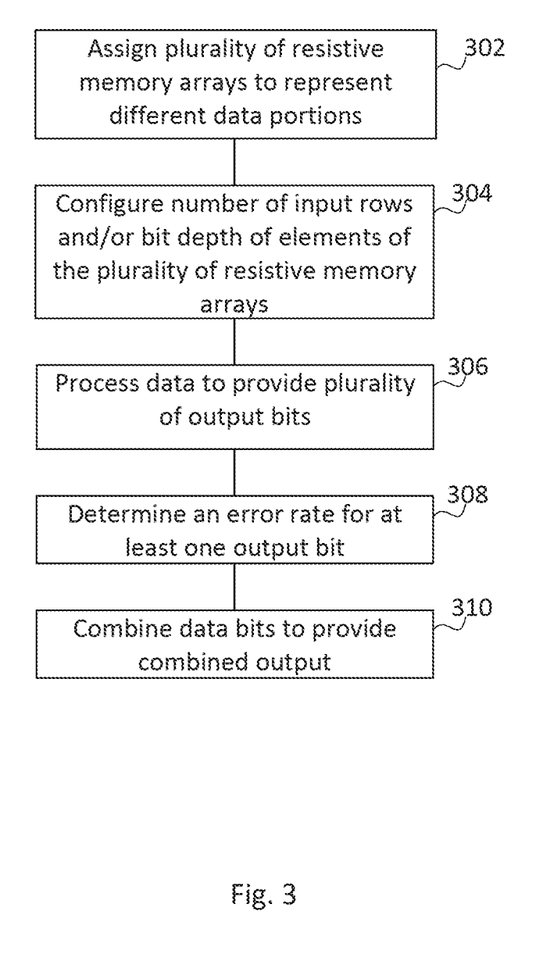
FIG. 3 is a flowchart of another example of a method for assigning input data to a resistive memory array based on a significance level.

FIG. 3 is another example of a method, which blocks 302 and 304 may for example comprise a method of carrying out block 108. In the method of FIG. 3, in block 302, a plurality of resistive memory arrays are assigned to represent different portions of the data input, the resistive memory arrays having at least one of differing numbers of rows (which may be a differing number of activated rows) and differing bit depths (i.e. at least one array may have a bit depth/number of rows which differs from at least one other array). The portions may comprise bit slices, i.e. data selected based on its position in a bit string. For example, the first portion of data may comprise bits 1 to n in a bit string of length m for each of a plurality of values (for example, bits 1 to n of values of a matrix representing an operand or kernel to be represented by an array or resistive memory elements), and a second portion of data may comprise bits n+1 to m in a bit string of length for each of a plurality of values (for example, bits n+1 to m of values of a matrix representing an operand or kernel to be represented by an array or resistive memory elements).

In block 304, the number of input rows and/or the bit depth of the resistive memory elements of a plurality of resistive memory array are configured according to the significance level of input data to be processed. In this example, therefore, the bit depth and/or the number of activated rows of an array are varied based on the intended computation accuracy for the computation to be carried out by that array. This may be carried out before or after the array is assigned to a processing task (for example, it may be carried out in anticipation of data with a particular significance level being received, or after the significance level of data has been determined). In the example of FIG. 3, this may result in resistive memory arrays having differing numbers of activated rows (where activated rows receive a voltage value of an input vector) and/or differing bit depths. An array may be considered to represent bits of activated rows, and not bits associated with rows which are not activated. At least one array representing a first number of bits is/are used in processing data portions deemed to be of high significance and at least one array representing a second number of bits is/are used to process data associate with a lower significance level. The first number of bits may be smaller than the second number of bits.

In an example, the bits of each portion are representative of a bit slice of an operand, each bit slice may be represented by an array having a bit depth according to the size of the bit slice. At least one array may have a bit depth which differs from at least one other array. In some examples, a data portion may be associated with some of the values of an input, for example with a sub-set of the rows of a matrix (or with a bit slice of a subset of the rows). In such an example, an array may be controlled to have this subset of rows mapped thereto (or to represent more rows, and have this subset of rows activated).

The method further comprises, in block 306, processing data (for example, an input voltage vector) with the plurality of memory arrays to provide output data comprising a plurality of output bits. Block 308 comprises determining, for at least one of the output bits, an error rate. The bit error rate for the output bits relating to a lower significance input data portion may generally be higher than the bit error rate for output bits relating to a high significance input data portion. In some examples, the arrays may be arranged such that the bit error rate for the high significance bits is below a first threshold (for example 1%, or less than 1 bit of the output, or some other threshold), whereas the bit error rate for the low significance bits is below a second threshold (for example 5% or less than 5 bits of the output, or the like).

As noted above, the bit error rate may vary across an array. It may be for example that the bit output from the bitline which is furthest from the input is most error prone. Therefore, this bit, and possibly at least one neighboring bit, may be approximated to a predetermined value (for example zero), in a process which may be termed 'dropping' the bit. By approximating the bit to a particular value rather than producing an output by carrying out analogue to digital conversion on the output of a bit line of the array, analogue to digital overhead may be reduced. In this case, as the bits which are to be approximated ('dropped') are the more error prone bits (for example, having an error rate which is above a threshold error rate), this may not result in any undue reduction in the accuracy of the result. By contrast, in this example, bits from bitlines closer to the inputs may be determined using analogue to digital conversion of the output.

In some examples, the number of bits represented by an array may be selected to provide a bit error rate (or a bit error rate of the most error prone bit) which is below a threshold rate, wherein the more significant the input bits, the lower the acceptable bit error rate.

In block 310, the output bits are combined to provide a combined output.

When using arrays to carry out matrix multiplications (for example using arrays as dot product engines), an input matrix/vector may be divided into multiple "bit sets" (each of which may be considered to separately comprise input data). One of a plurality of arrays may be used to perform a processing operation on a plurality of bit sets to generate partial results. These partial results may be combined with appropriate shift and add units to obtain a result vector.

To consider this in greater detail, when using an array to carry out a matrix operation such as A*B (where A is an input vector and B is a matrix to be represented by an array), in a simple example, each element of B may be mapped to an element of the array and each element of A may be converted to an appropriate analog voltage value applied to an input row of the array. However, it may be the case that the number of levels in an element of a resistive memory array) is around 5 bits at most, but the calculation may suggest 16-64b per element. To support these large numbers, each element of A and/or B may be divided in to multiple bit sets (each bit set comprising a set of "n" bits) and mapped across multiple arrays.

For example, consider a matrix made of 16b elements. With an array having a bit depth of 5 bits per element, four such arrays would be need to fully represent B (assuming that array has sufficient number of rows to fully map all the rows in B). If each element of input vector A is 8b, two sets of four arrays may be used to compute A*B in one cycle, or else multiple cycles (in this example, two cycles) could be used, one for each bit sets of A to complete the operation.

When splitting an input into multiple bit sets, it has been proposed to provide slices of equal size, and to map this to a homogeneous set of arrays acting as dot product engines. This means that all bit sets/data inputs will be processed using the same computational resources and having the same error rate. However, in the example below, bit slices of different sizes are considered.

Figure 4:
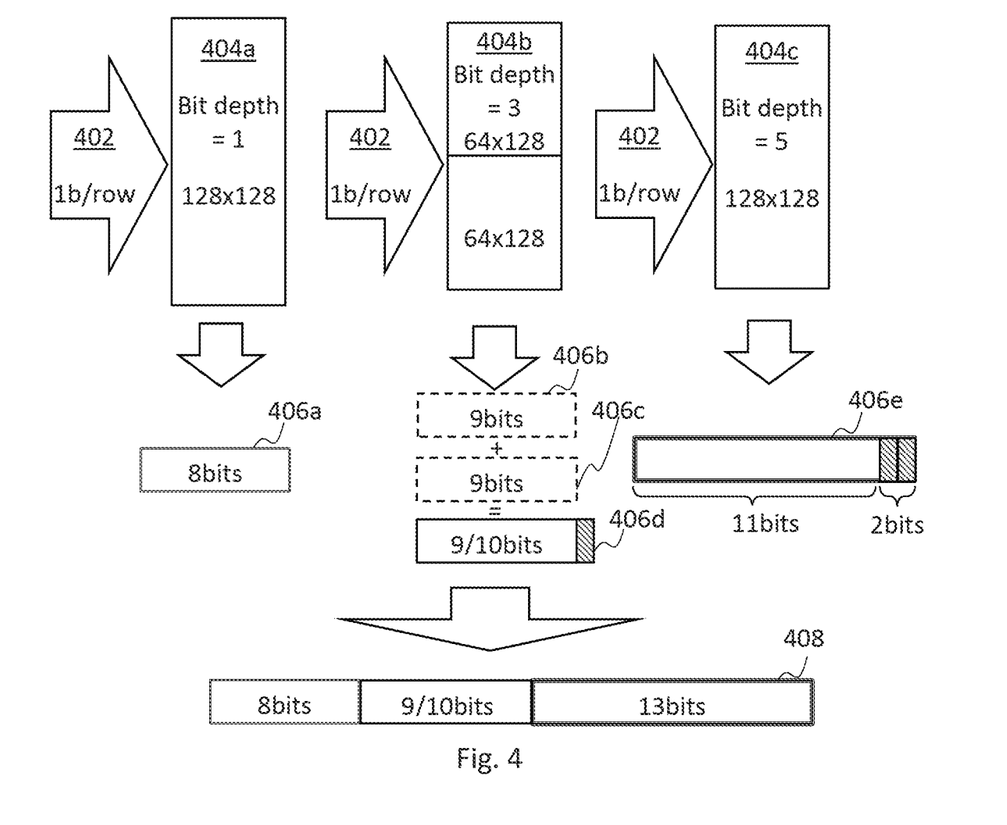
FIG. 4 is a simplified schematic of an example of processing input data using an example heterogeneous set of resistive memory arrays.

FIG. 4 shows a schematic representation of an example of the processing and combining of output data. As described above, in some data processing tasks, not all bits are equally significant.

In this example, a matrix M represents a processing kernel or operator which is to be multiplied with an input vector, and a voltage vector V is to be processed using three different arrays 404, each representing a portion (a bit slice) of an original matrix M. For the sake of example, the input data comprises a matrix M is a 128*128 matrix, and each matrix element represents 9 bits of data. A bit slice 402 of the voltage vector V is represented a one dimensional matrix having 128 elements, each with a bit depth of one.

In this example, the first few bits of the values of M are deemed to be of high significance. A bit slice from the middle of the input have a medium significance level and a bit slice from the end of the input has a low significance level. This can be understood on the basis that the input may represent a large number, the first few bits in the number are of higher significance as if the last few bits are wrong, the number as a whole will be wrong by a small amount. The number of high, medium and low significance bits within a particular input may vary, for example as a function of user selection and/or the type of application being run. For example, when performing Monte Carlo modelling or operating on deep learning workloads, it may be that more bits can be assigned as low significance that in some other application, for example a scientific applications requiring accurate modelling.

In this example, a first array 404a, comprising 128×128 resistive elements, is written such that each element of the array 404a represents one bit of the corresponding element of M. This may be the most significant bit in each element, for example, the first bit.

A second array 404b, comprising 128×128 elements, is written to represent the middle bit slice such that each element of the array 404b represents three bits of the corresponding element of rows or columns M. This may for example be the 3 bits following the first bit.

This array 404b can be accessed in multiple stages. In this example, it is accessed in two stages, such that the first 64 rows receive an input representing first 64 rows of the voltage vector 402 in a first operation and the second 64 rows receive an input representing second 64 rows of the voltage vector 402 in a second operation. In other words, a subset (in this example, half) of the rows of the array 404b are activated at one time, and thus the array 404b represents each subset in turn. This increases the precision of the output of the array 404b when compared to carrying out the operation in one stage at the cost of increased processing time, and may therefore be associated with a higher significance level than may be associated with processing the voltage vector in one stage. Dividing the data into data portions in this way may be carried out independently of, or in combination with, dividing the data into bit slices.

A third array 404c, comprising 128×128 elements, is written such that each element of the array 404a represents five bits of the corresponding element of M. This may for example be the trailing five bits of each value of M.

The bit slice 402 of the voltage vector V is then applied to each of the different resistive memory arrays 404 to produce outputs with different output precision. The bits output by the resistive memory array 404a of elements having a bit depth of one may be associated with a higher degree of precision than those output by the array 404b having elements with a bit depth of three, which in turn have a higher degree of precision than the dense (i.e. having a high bit depth), resistive memory array 404c, having elements with a bit depth of five.

It may be noted that, in this case, the bit slice 402 comprises elements with a bit depth of one. This may be fully representative of the voltage vector V but may equally comprise a data portion of V. For example, if each element in the input vector is eight bits, every bit of the vector V is applied to all the three arrays in eight iterations. The result from each iteration is combined using a shift and add operation.

Similar to bit slices in matrix elements, vector elements can also be divided into bit slices of different sizes based on their significance. For example, if each element of the input vector is eight bits, then the lower four bits can be processed in a single iteration (in this case, the bit slice 402 would comprise four, rather than one, bit). In this case, the ADC bits are adjusted to handle the extra bits from DAC. This may increase the likelihood of error, but may also reduce energy consumption and latency. The higher significance bits can be processed, for example as four bit slices, in four iterations one bit at a time.

It may be noted that the number of output bits in the example of FIG. 4 are determined using the version of the equation above in the condition under which $DAC_b$ is equal to 1. However if each row processes more than one bit, then the number of output bits is evaluated using the relationship for the case where $DAC_b$ is greater than 1.

The set of resistive memory arrays 404 in FIG. 4 is therefore heterogeneous, rather than homogeneous, and can perform matrix multiplications such as dot products in which there may be a trade-off between energy consumption and accuracy of computation.

In this example the resistive memory array 404a representing the high significance data portion having bit depth of one and 128 rows, and receiving one bit inputs, outputs an output 406a comprising eight bits (from the equation above). The resistive memory array 404b representing the middle significance data portion is activated twice. In this example, the resistive memory array 404b has 128 rows. A first 64 of these rows are activated in a first computation and a second 64 of the rows are activated in a second computation. Each of these computation outputs a 9 bit output 406b, 406c (from the equation above). The outputs 406b, 406c from both computations is summed to provide a summed output 406d. This may comprise a 9 bit summed output or a 10 bit summed output. If a 10 bit summed output is produced, the $10^{th}$ bit may, in some examples, be approximated to a predetermined value (for example to zero) rather than determined using analogue to digital conversion (i.e. 'dropped') without undue loss of accuracy. The resistive memory array 404c representing the low significance bits having a bit depth of five and 128 rows, and receiving one bit inputs outputs a 13 bit output 406e.

In this example the error rate on the last two bits of the output 406c in relation the least significant bits is determined to exceed a threshold. Therefore, in this example, these are approximated to a predetermined value (for example to zero) rather than determined using analogue to digital conversion.

The outputs 406a, 406d and 406c are combined with relative shifts. In this example, the summed output 406d from the middle significance bits is shifted by 13 bits, and the output relating to the most significant bits is shifted by 9 (or 10)+13 bits from each array 404 is shifted based on these configuration registers to derive a final result 408.

Figure 5:
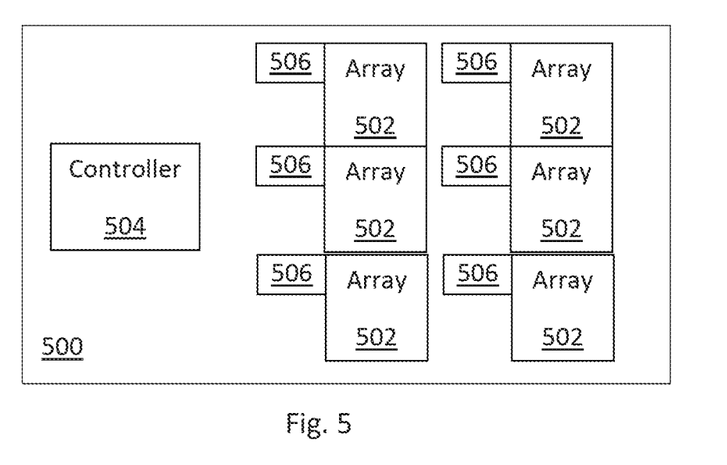
FIGS. 5 and 6 are schematic examples of a processing apparatus.

FIG. 5 shows a processing apparatus 500 comprising a plurality of arrays 502 and a controller 504. Each of the arrays 502 comprises an array of resistive memory elements (not shown) and is associated with at least one configuration register 506 to specify a number of bits which may be represented by the associated array. The configuration register 506 may for example comprise at least one of a row height register specifying the activated row height of the associated array and a bit depth register specifying a bit depth of the resistive memory elements of the array.

The controller 504 is to assign input data associated with a significance level to one of the plurality of arrays 502 based on the significance level, wherein input data associated with a higher significance level is assigned to (for example to be represented by, or to be processed using) an array representing fewer bits (for example, having a lower row height and/or smaller element bit depth) than an array to which data associated with a lower significance level is assigned. In some examples therefore, the set of arrays may be heterogeneous, with at least one of the arrays representing a greater number of bits than at least one other array.

In some examples, the controller 504 is to control the activated row height and the bit level depth of an array based on the significance level of data assigned thereto. In such examples, this may comprise changing a value held in the configuration register 506 of at least one array.

Figure 6:
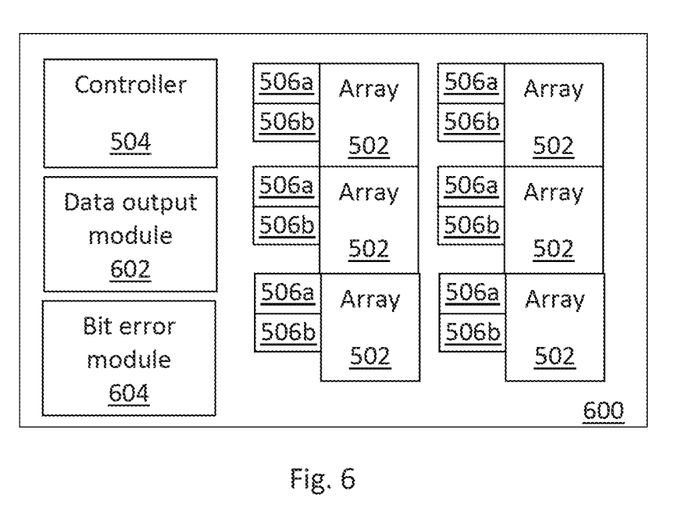

FIG. 6 comprises a further example of a processing apparatus 600. The apparatus 600 comprises a plurality of arrays 502 and a controller 504 as described in relation to FIG. 5. In this example, each of the arrays comprises a first and a second configuration register: a row height register 506a specifying the activated row height of the associated array and a bit depth register 506b specifying a bit depth of the resistive memory elements of the array 502. In some examples, the input data may comprise a plurality of input data portions, each comprising a bit slice of a data input, and the controller 504 is to assign the portions of the input data to a plurality of different arrays 502 based on the significance level associated with each data portion.

The processing apparatus 600 comprises a data output module 602 to receive at least one output bit from a plurality of different arrays 502 and to combine the output bits to provide a combined output comprising a plurality of output bits having a bit sequence corresponding to a data input. In other words, each array 502 may output some number of bits. These bits may be combined by the data output module 602, for example as shown in FIG. 4, such that the output bit depth is equal to a target operand output width specified by the processing operation being carried out by the processing apparatus 600. For example, the combination of data bits may be carried out as described in relation to FIG. 4.

The processing apparatus 600 further comprises a bit error module 604, which estimates the bit error rate of the output bits based on their position in a bit sequence. The data output module 602 may 'drop' bits (i.e., approximate the bits to a predetermined value such as 0 rather than determine these bits using analogue to digital conversion of an output voltage) having a bit error rate above a threshold bit error rate from the combined output.

Figure 7:
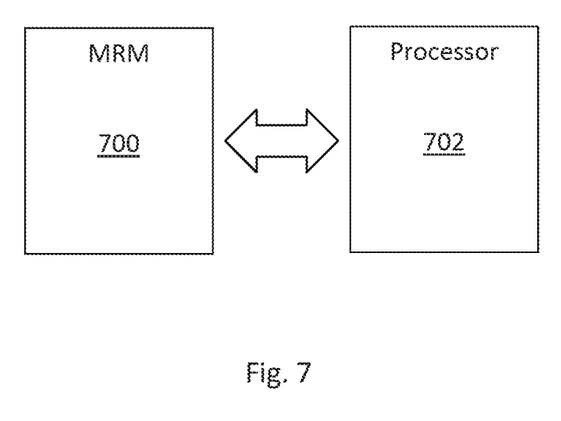
FIG. 7 is a schematic example of a machine readable medium associated with a processor.

FIG. 7 shows a machine readable medium 700 in association with a processor 702. The machine readable medium 700 stores instructions which, when executed by the processor 702, cause the processor 702 to divide input data into at least two data portions having a size based on a significance level, and to assign a resistive memory array to at least a data portion of the input data. The machine readable medium 700 further stores instructions which, when executed by the processor 702 cause the processor 702 to generate a control signal to control, according to the significance level, at least one of (i) the assigned resistive memory array to process the data portion in a logical operation and (ii) the assigned resistive memory array to have an input row height (i.e. an activated row height) and a bit depth to represent the data portion.

In some examples, the machine readable medium 700 may further comprise instructions which, when executed by the processor 702, cause the processor 702 to divide input data into a plurality of bit slices having different sizes, to generate a control signal to cause a plurality resistive memory arrays to have an a bit depth according to sizes of the bit slices; and to cause each bit slice to be represented by a resistive memory array having a bit depth appropriate for the size of that bit slice.

Examples in the present disclosure can be provided as methods, systems or machine readable instructions, such as any combination of software, hardware, firmware or the like. Such machine readable instructions may be included on a machine readable storage medium (including but is not limited to disc storage, CD-ROM, optical storage, etc.) having machine readable program codes therein or thereon.

The present disclosure is described with reference to flow charts and/or block diagrams of the method, devices and systems according to examples of the present disclosure. Although the flow diagrams described above show a specific order of execution, the order of execution may differ from that which is depicted. Blocks described in relation to one flow chart may be combined with those of another flow chart. It shall be understood that each flow and/or block in the flow charts and/or block diagrams, as well as combinations of the flows and/or diagrams in the flow charts and/or block diagrams can be realized by machine readable instructions.

The machine readable instructions may, for example, be executed by a general purpose computer, a special purpose computer, an embedded processor or processors of other programmable data processing devices to realize the functions described in the description and diagrams (for example, the processing apparatus 500, 600, the processor 702, the controller 504, the data output module 602 and/or the bit error module 604). In particular, a processor or processing apparatus may execute the machine readable instructions. Thus functional modules of the apparatus and devices may be implemented by a processor executing machine readable instructions stored in a memory, or a processor operating in accordance with instructions embedded in logic circuitry. The term 'processor' is to be interpreted broadly to include a CPU, processing unit, ASIC, logic unit, or programmable gate array etc. The methods and functional modules may all be performed by a single processor or divided amongst several processors.

Such machine readable instructions may also be stored in a computer readable storage (for example, the machine readable medium 700) that can guide the computer or other programmable data processing devices to operate in a specific mode.

Such machine readable instructions may also be loaded onto a computer or other programmable data processing devices, so that the computer or other programmable data processing devices perform a series of operations to produce computer-implemented processing, thus the instructions executed on the computer or other programmable devices realize functions specified by flow(s) in the flow charts and/or block(s) in the block diagrams.

Further, the teachings herein may be implemented in the form of a computer software product, the computer software product being stored in a storage medium and comprising a plurality of instructions for making a computer device implement the methods recited in the examples of the present disclosure.

While the method, apparatus and related aspects have been described with reference to certain examples, various modifications, changes, omissions, and substitutions can be made without departing from the spirit of the present disclosure. It is intended, therefore, that the method, apparatus and related aspects be limited only by the scope of the following claims and their equivalents. It should be noted that the above-mentioned examples illustrate rather than limit what is described herein, and that those skilled in the art will be able to design many alternative implementations without departing from the scope of the appended claims. Features described in relation to one example may be combined with features of another example.

The word "comprising" does not exclude the presence of elements other than those listed in a claim, "a" or "an" does not exclude a plurality, and a single processor or other unit may fulfil the functions of several units recited in the claims.

The features of any dependent claim may be combined with the features of any of the independent claims or other dependent claims.

The invention claimed is:

1. A processing apparatus comprising:
   a plurality of arrays of resistive memory elements;
   a first and second configuration register, wherein at least one of the arrays is associated with the first and second configuration register, and the first and second configuration register is to specify a number of bits to be represented by the associated array, including the first configuration register to specify an activated row height of the associated array, and the second configuration register the specify a bit depth of the resistive memory elements of the associated array; and
   a controller to assign input data associated with a significance level to the associated array based on the significance level, wherein the controller is to assign input data associated with a higher significance level to an array representing a first number of bits, and the controller is further to assign input data associated with a lower significance level to an array representing a second number of bits, wherein the first number of bits is smaller than the second number of bits, and wherein the controller is to control at least one of the activated row height and the bit depth of the associated array based on the significance level of data assigned thereto.

2. The processing apparatus according to claim 1 in which the input data comprises a plurality of input data portions, each input data portion comprising a bit slice of a data input, and the controller is to assign the input data portions to a plurality of different arrays of the plurality of arrays based on a significance level associated with each input data portion,
   the processing apparatus further comprising a data output module to receive at least one output bit from the plurality of different arrays and to combine the output bits to provide a combined output comprising a plurality of output bits having a bit sequence corresponding to the data input.

3. The processing apparatus according to claim 2 which further comprises a bit error module to estimate a bit error rate of at least one output bit from at least one array of the plurality of arrays, wherein the data output module is to approximate bits having a bit error rate above a threshold bit error rate from the combined output to a predetermined value.

4. The processing apparatus according to claim 2, wherein an output bit depth of the plurality of output bits is equal to a target operand output width specified by a processing operation being carried out by the processing apparatus.

5. The processing apparatus according to claim 1, wherein the input data is associated with an application type and at least one of the higher or lower significance level is based at least in part on the application type.

6. The processing apparatus according to claim 1, wherein a portion of the input data is associated with a significance level based on a content of the input data.

7. A processing apparatus comprising:
   a plurality of arrays of resistive memory elements;
   at least one configuration register, wherein at least one of the arrays is associated with the at least one configuration register, and the at least one configuration register is to specify a number of bits to be represented by the associated array;
   a controller to assign input data portions of input data to different arrays of the plurality of arrays based on a significance level associated with each input data portion, wherein each data portion comprises a bit slice of the input data and wherein the controller is to assign an input data portion associated with a higher significance level to an array representing a first number of bits, and the controller is further to assign an input data portion associated with a lower significance level to an array representing a second number of bits, wherein the first number of bits is smaller than the second number of bits; and
   a data output module to receive at least one output bit from each of the different arrays and to combine the output bits to provide a combined output comprising a plurality of output bits having a bit sequence corresponding to the data input.

8. The processing apparatus of claim 7, further comprising a bit error module to estimate a bit error rate of at least one output bit from at least one array of the plurality of arrays, wherein the data output module is to approximate bits having a bit error rate above a threshold bit error rate from the combined output to a predetermined value.

9. A method comprising:
   configuring, by at least one configuration register associated with an array of a plurality of arrays of resistive memory elements, a number of bits to be represented by the associated array;
   assigning input data portions of input data to different arrays of the plurality of arrays based on a significance level associated with each input data portion, wherein each data portion comprises a bit slice of the input data and wherein assigning the input data portions includes assigning an input data portion associated with a higher significance level to an array representing a first number of bits, and assigning an input data portion associated with a lower significance level to an array representing a second number of bits, wherein the first number of bits is smaller than the second number of bits;
   receiving, by a data output module, at least one output bit from each of the different arrays; and
   combining the output bits to provide a combined output comprising a plurality of output bits having a bit sequence corresponding to the data input.

10. The method according to claim 9, wherein configuring the number of bits to be represented by the associated array further comprises configuring, according to the significance level of the input data to be processed, at least one of (i) a number of input rows and (ii) a bit depth of resistive memory elements of the associated array.

11. The method according to claim 9, further comprising:
    processing data with each of the different arrays to provide the at least one output bit from each of the different arrays.

12. The method according to claim 9 where the input data is associated with an application type and at least one of the higher or lower significance level is based at least in part on the application type.

13. The method according to claim 9, further comprising determining a significance level for portions of the input data based on a content of the input data.

14. The method of claim 9, further comprising estimating a bit error rate of at least one output bit from at least one array of the plurality of arrays.

15. The method of claim 14, further comprising dropping, by the data output module, output bits having a bit error rate above a threshold bit error rate from the combined output.

* * * * *